(12) United States Patent
Herard et al.

(10) Patent No.: US 12,356,743 B2
(45) Date of Patent: Jul. 8, 2025

(54) SLANTED GLASS EDGE FOR IMAGE SENSOR PACKAGE

(71) Applicant: STMicroelectronics PTE LTD, Singapore (SG)

(72) Inventors: Laurent Herard, Singapore (SG); David Gani, Singapore (SG)

(73) Assignee: STMicroelectronics PTE LTD, Singapore (SG)

(*) Notice: Subject to any disclaimer, the term of this patent is extended or adjusted under 35 U.S.C. 154(b) by 0 days.

(21) Appl. No.: 18/582,860

(22) Filed: Feb. 21, 2024

(65) Prior Publication Data

US 2024/0194709 A1   Jun. 13, 2024

Related U.S. Application Data

(62) Division of application No. 17/326,537, filed on May 21, 2021, now Pat. No. 11,942,496.

(60) Provisional application No. 63/034,464, filed on Jun. 4, 2020.

(51) Int. Cl.
   *H10F 39/00* (2025.01)

(52) U.S. Cl.
   CPC ................... *H10F 39/804* (2025.01)

(58) Field of Classification Search
   CPC ......... H01L 27/14618; H01L 27/14632; H01L 27/14634
   See application file for complete search history.

(56) References Cited

U.S. PATENT DOCUMENTS

| | | | |
|---|---|---|---|
| 9,294,697 B2* | 3/2016 | Iwasaki | H01L 27/14645 |
| 9,503,622 B2 | 11/2016 | Jiang et al. | |
| 9,653,504 B1 | 5/2017 | Lin et al. | |
| 10,312,276 B2 | 6/2019 | Chien et al. | |
| 2008/0186583 A1 | 8/2008 | Takayama | |
| 2009/0200622 A1 | 8/2009 | Tai et al. | |
| 2010/0252902 A1* | 10/2010 | Tanida | H01L 27/14632 257/E31.127 |
| 2015/0015751 A1 | 1/2015 | Iwasaki et al. | |
| 2016/0005778 A1* | 1/2016 | Jun | H01L 27/14618 257/434 |
| 2017/0154913 A1 | 6/2017 | Jun | |

(Continued)

FOREIGN PATENT DOCUMENTS

| | | |
|---|---|---|
| CN | 1652342 A | 11/2008 |
| CN | 107817548 A | 3/2018 |
| CN | 216311782 U | 4/2022 |

(Continued)

OTHER PUBLICATIONS

EP Search Report and Written Opinion for family-related EP Appl. No. 21177013.6, report dated Nov. 11, 2021, 8 pages.

(Continued)

*Primary Examiner* — Jonathan Han

(74) *Attorney, Agent, or Firm* — Crowe & Dunlevy LLC

(57) ABSTRACT

Disclosed herein is a method of reducing noise captured by an image sensor. The method includes affixing a bottom surface of a glass covering to the image sensor, permitting light to impinge upon the glass covering, and shaping the glass covering such that when the light that impinges upon the glass covering impinges upon a sidewall of the glass covering, the sidewall reflects the light on a trajectory away from the image sensor.

17 Claims, 2 Drawing Sheets

(56) References Cited

U.S. PATENT DOCUMENTS

2019/0019831 A1* 1/2019 Takachi ............ H01L 27/14685
2019/0165024 A1   5/2019 Bradley, Jr. et al.

FOREIGN PATENT DOCUMENTS

EP     1560270 A2    8/2005
KR  20100055737 A    5/2010
WO   2018028718 A1   2/2018

OTHER PUBLICATIONS

CN First Office Action and Search Report for counterpart CN Appl. No. 202110626211.6, report dated Nov. 12, 2024, 10 pgs.

* cited by examiner

SLANTED GLASS EDGE FOR IMAGE SENSOR PACKAGE

RELATED APPLICATION

This is a division of U.S. patent application Ser. No. 17/326,537, filed on May 21, 2021, which itself claims priority to U.S. Provisional Patent Application No. 63/034,464, filed Jun. 4, 2020, the contents of both of which are incorporated by reference in their entirety to the maximum extent allowable under the law.

TECHNICAL FIELD

This disclosure relates to the field of digital image sensors and, in particular, to a design for a glass covering for an image sensor of an image sensor package that reduces the incidence of stray light on the image sensor to thereby reduce noise in the image acquired by the image sensor.

BACKGROUND

Digital image sensor packages are utilized in a wide array of electronic devices, such as laptops, smartphones, and tablets, so as to provide the capability of image capture.

A sample known digital image sensor package 10 in a glass-on-die packaging arrangement is shown in FIG. 1. An image sensor substrate 12 is disposed on a printed circuit board 11, and photodiodes 13 are formed in or on the image sensor substrate 12. A transparent adhesive layer 14 physically couples a glass covering 15 over the image sensor substrate 12. While this design is relatively simple and is in wide production, an issue arises in that some incoming light IL may arrive along a path whereby it enters the top side of the glass 15, then reflects off the sidewall of the glass 15 on a path leading it to strike the photodiodes 13. This path results in this incoming light IL not carrying usable information about the scene being captured, and instead simply causing noise in the information about the scene otherwise captured by the photodiodes 13.

Attempts at mitigating or eliminating this issue have been made. As shown in the digital image sensor package 10' of FIG. 2, photoabsorbent material 17 may be placed at the edge of the glass 15 such that the incoming light IL that would otherwise reflect off the sidewall of the glass 15 is absorbed, minimizing the resulting noise in the information about the scene captured by the photodiodes 13. While this design works, it adds additional steps to the manufacture of the image sensor package 10', may be incompatible with the physical layouts of some digital image sensor packages, and may be unreliable as the photoabsorbent material 17 may become detached.

Therefore, further development is needed.

SUMMARY

Disclosed herein is method for diminishing noise in images captured by an image sensor. The method involves attaching a glass covering directly to the image sensor. The glass covering allows light to reach it and is crafted in a particular shape to ensure that any light contacting the glass covering at the sidewall thereof is directed away from the image sensor.

A aspect includes the shaping of the glass covering. The glass cover is designed with a trapezoidal cross-section which ensures that light contacting the sidewalls is deflected away from the image sensor. This trapezoidal shape includes by an obtuse angle between the sidewall and the bottom surface, which aids in the redirection of incoming light.

The angle between the sidewall and the bottom surface is tuned based on the specific field of view of the image sensor and the expected lighting conditions in the environment. This allows for the optimization of light deflection and, consequently, noise reduction. The shaping of the glass covering can be achieved through cutting techniques, including mechanical sawing or chemical etching.

To secure the glass covering to the image sensor, a transparent adhesive layer is utilized. This provides for the covering to remain in the correct position while not interfering with light transmission.

Furthermore, the glass covering is positioned at a carefully calculated distance from the image sensor to ensure the optimal trajectory of the reflected light, thereby preventing it from reaching the photodiodes. The glass covering is also designed with a larger top surface area compared to the bottom, enhancing the light reflection characteristics and contributing to the method's efficacy in noise reduction.

Also described herein is a method for constructing a digital image sensor package, which is focused on reducing noise in the images captured. The method involves placing an image sensor substrate onto a printed circuit board (PCB) and coupling a transparent covering with the image sensor substrate. This transparent covering is defined by a bottom surface, a top surface opposite the bottom, and a sidewall that outlines the perimeter edge, thus covering the image sensor substrate.

Of interest is the formation of two distinct angles by the sidewall with the top and bottom surfaces of the transparent covering. The first angle, formed with the top surface, and the second angle, with the bottom surface, are different. This difference in angles helps provide that that light entering the transparent covering is deflected in such a manner that it avoids hitting the image sensor substrate, consequently diminishing noise in the resulting images.

In this assembly, the transparent covering is secured to the image sensor substrate using a transparent adhesive layer that maintains optical clarity and ensures the covering stays in place. The sidewall of the transparent covering is specifically shaped so that the first angle is acute and the second angle is obtuse. This shape facilitates the proper reflection of light on a trajectory that avoids the image sensor substrate.

The material for the transparent covering is selected based on its optical characteristics, which are useful for reflecting light at the intended angles without significant light absorption. Moreover, the dimensions of the transparent covering are tailored based on the size of the image sensor substrate and the anticipated range of angles for incoming light, providing that the covering effectively contributes to the reduction of noise in captured images.

Also disclosed herein is a process for formation of a digital image sensor package that contributes to improved image quality by directing undesired light away from sensitive components. The method begins with the placement of an image sensor substrate on a printed circuit board (PCB), where photodiodes are positioned on the substrate to capture images.

A glass covering is then shaped to possess a top surface with an area larger than its bottom surface, as well as a sidewall defining the glass covering's perimeter edge. The sidewall creates an obtuse angle with the bottom surface and an acute angle with the top surface, thereby ensuring that the sidewall is slanted relative to normal. This slant is designed to direct incoming light on a path that steers clear of the photodiodes, thus reducing the likelihood of image noise.

The angles formed by the sidewall are carefully calculated, with the obtuse angle ranging from 120° to 140° and the acute angle ranging from 40° to 60°. These precise angles are helpful in controlling the direction of light within the sensor package.

To integrate the glass covering with the image sensor substrate, mounting hardware is attached to the PCB to encircle the image sensor substrate partially, maintaining a set distance. The mounting hardware holds the glass covering in a designated position relative to the image sensor substrate, supporting proper alignment and stability.

The design of the mounting hardware includes a section that affixes to the PCB and projects upward, another section that extends inward from the image sensor substrate's periphery toward the photodiodes, and a connecting segment that unites these sections. This configuration not only secures the glass covering in its optimal position but also reinforces the structural unity of the glass covering, the PCB, and the image sensor substrate.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 3:
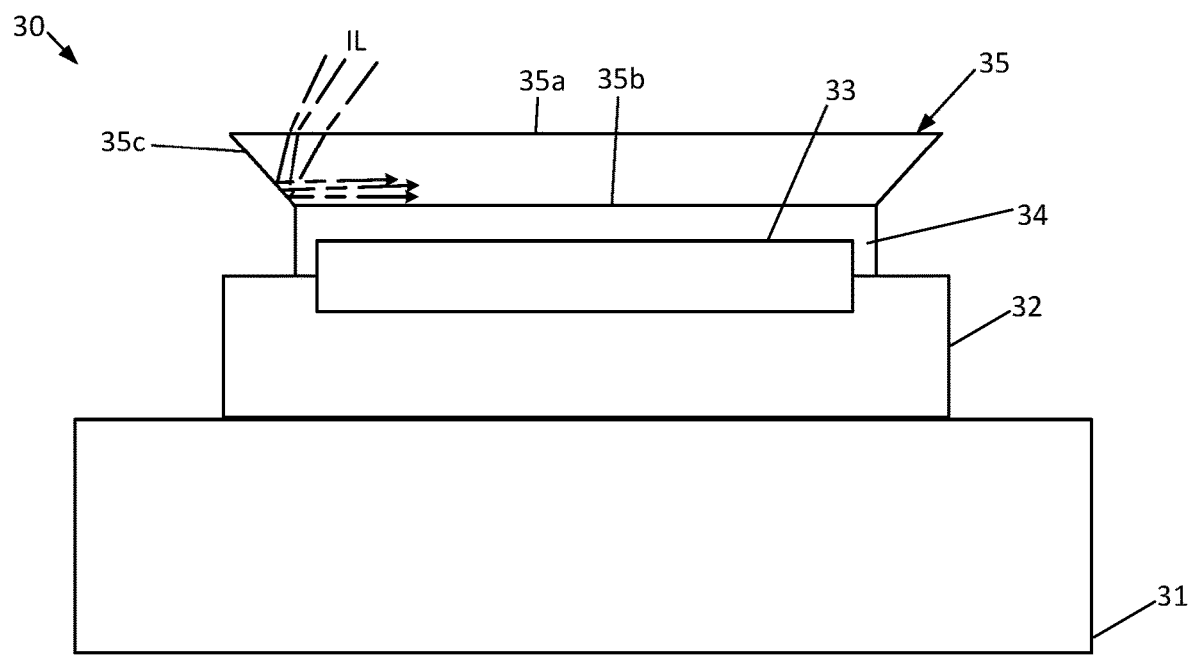
FIG. 3 is a side view of a digital image sensor package in glass-on-die format disclosed herein that addresses the drawbacks of the known digital image sensor package of FIG. 1 by appropriately shaping the glass.

A digital image sensor package 30 in a glass-on-die packaging arrangement is shown in FIG. 3. An image sensor substrate 32 is disposed on a printed circuit board (PCB) 31, and photodiodes 33 are formed in or on the image sensor substrate 32. A transparent adhesive layer 34 physically couples a covering 35 (e.g., glass, such as a glass lens) over the image sensor substrate 32.

In greater detail, the glass covering 35 has a top surface 35a, a bottom surface 35b, and a sidewall 35c delimiting a perimeter edge of the glass covering. The bottom surface 35b of the glass covering 35 is physically coupled to the image sensor substrate 32 over the photodiodes 33 by the transparent adhesive layer 34. The top surface 35a of the glass covering 35 is greater in diameter and/or surface area than the bottom surface 35b, such that the sidewall 35c is angled with respect to normal (i.e., is angled away from a direction perpendicular to the bottom surface 35b and/or the plane within which the photodiodes 33 are formed for the substrate 32 and/or the bottom of the PCB 31). In particular, the angle formed by the sidewall 35c and the bottom surface 35b is an obtuse angle (greater than 90°), and/or the angle formed by the sidewall 35c and the top surface 35a is an acute angle (less than 90°).

The purpose of the angles formed by the sidewall 35c with respect to the top surface 35a and/or bottom surface 35b of the glass covering 35 is to cause incoming light IL that reflects off the sidewall 35c to reflect along a trajectory that avoids the photodiodes 33, as illustrated. This way, despite the fact that incoming light IL is reflecting off the sidewall 35c, it does not contribute to noise in the information about the scene captured by the photodiodes 33, thereby providing for better image quality.

In addition, another benefit provided by sidewall 35c shape of the glass covering 35 is that photoabsorbent materials (such as used in the design of FIG. 2) are not necessary. Indeed, the digital image sensor package 30 is devoid of photoabsorbent materials positioned between the sidewall 35c and the top of the image sensor substrate 32, and no such photoabsorbent materials (such as those used in the design of FIG. 2) are present between the sidewall 35c and the top of the image sensor substrate 32. By eliminating such photoabsorbent materials, steps for forming such materials and attaching them to the glass covering 35 during manufacture are eliminated.

Figure 4:
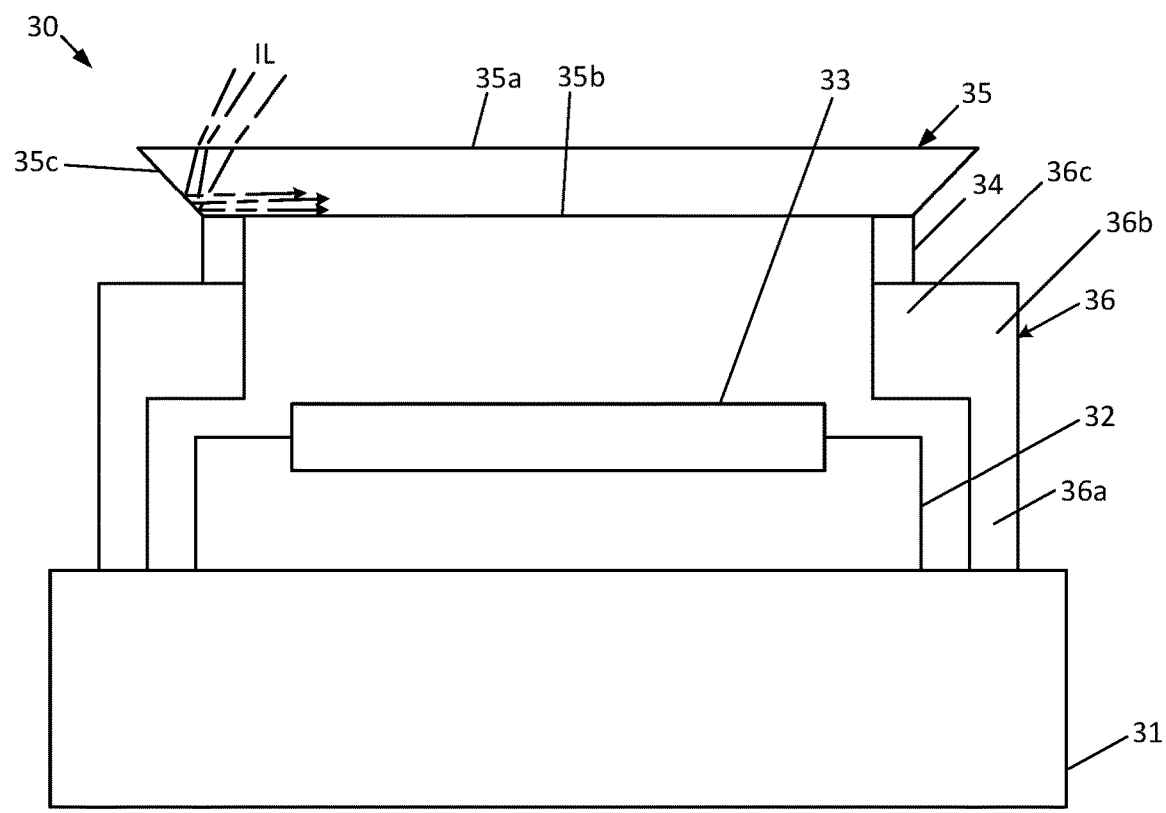
FIG. 4 is a side view of a digital image sensor package in land-grid-array format disclosed herein that addresses the drawbacks of the known digital image sensor package of FIG. 1 by appropriately shaping the glass.

Another digital image sensor package 30' is shown in FIG. 4. This digital image sensor package 30' is in a land-grid-array arrangement. In greater detail, as with the digital image sensor package 30 of FIG. 3, the image sensor substrate 32 is disposed on the printed circuit board 31, and photodiodes 33 are formed in or on the image sensor substrate 32. Here, however, mounting hardware 36 is affixed to the printed circuit board 31, and surrounds at least a portion of the periphery of the image sensor substrate 32 in a spaced apart fashion so as to not contact the image sensor substrate 32. The mounting hardware 36 is comprised of a first portion 36a affixed to the printed circuit board 31 and extending upwardly therefrom, a second portion 36c extending inwardly from the periphery of the image sensor substrate 32 toward the photodiodes 33, and an intermediate connecting portion 36b that connects the first portion 36a to the second portion 36c.

An adhesive layer 34 (which may be transparent) physically couples a glass covering 35 (e.g., a lens) to the top surface of the second portion 36c of the mounting hardware 36, such that the glass covering 35 overlies the image sensor substrate 32. The glass covering 35 has a top surface 35a, a bottom surface 35b, and a sidewall 35c. The periphery of the bottom surface 35b of the glass covering 35 is physically coupled to the second portion 36c of the mounting hardware 36. The top surface 35a of the glass covering 35 is greater in diameter and/or surface area than the bottom surface 35b, such that the sidewall 35c is angled with respect to normal (as defined noted above). As stated earlier, the angle formed by the sidewall 35c and the bottom surface 35b is an obtuse angle (greater than 90°), and/or the angle formed by the sidewall 35c and the top surface 35a is an acute angle (less than 90°), and the purpose of the angles formed by the sidewall 35c with respect to the top surface 35a and bottom surface 35b of the glass covering 35 is to cause incoming light IL that reflects off the sidewall 35c to reflect along a trajectory that avoids the photodiodes 33.

The glass covering 35 of FIGS. 3-4 may be formed to have the above described angles by suitable cutting methodologies, for example using mechanical sawing or chemical etching. The angle formed by sidewall 35c with respect to the top surface 35a may be in the range of 40° to 60° for example, and the angle formed by the sidewall 35c with respect to the bottom surface 35b may be in the range of 120° to 140° for example. Other suitable angles may be used as well. The top surface 35a and bottom surface 35b are illustrated as being straight and not curved, although in some applications, the top surface 35a and bottom surface 35b may be concave or convex as desired. In addition, in some instances, the sidewall 35c may be concave or convex as desired.

Figure 1:
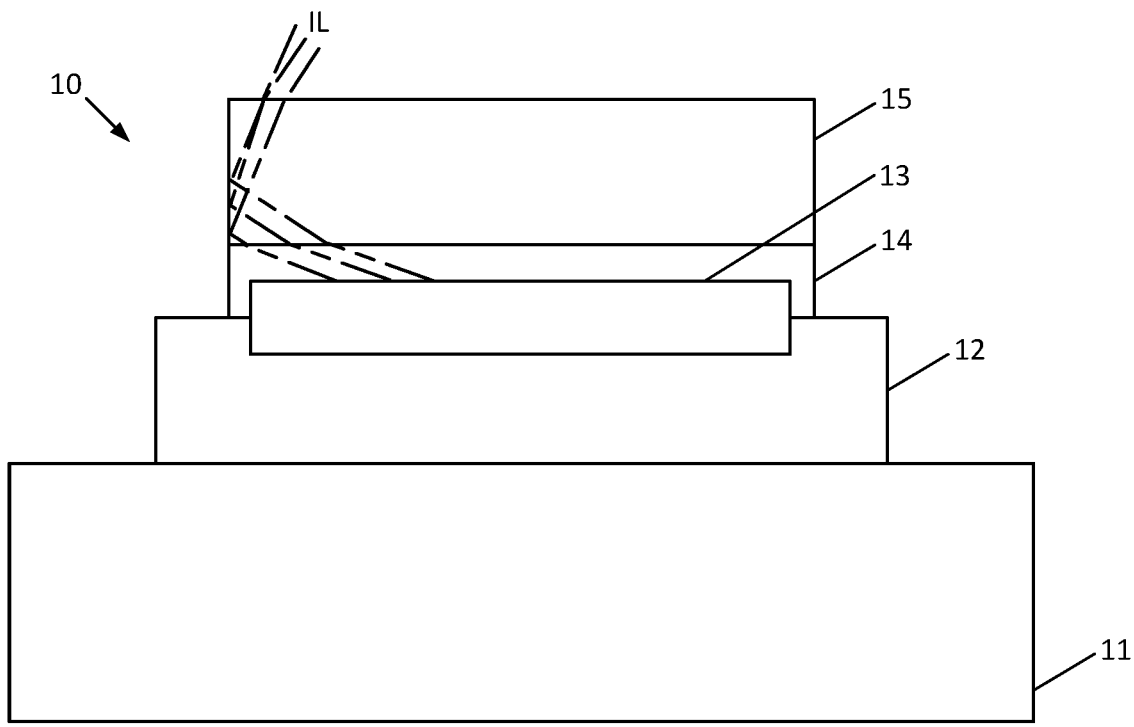
FIG. 1 is a side view of a known digital image sensor package.
Figure 2:
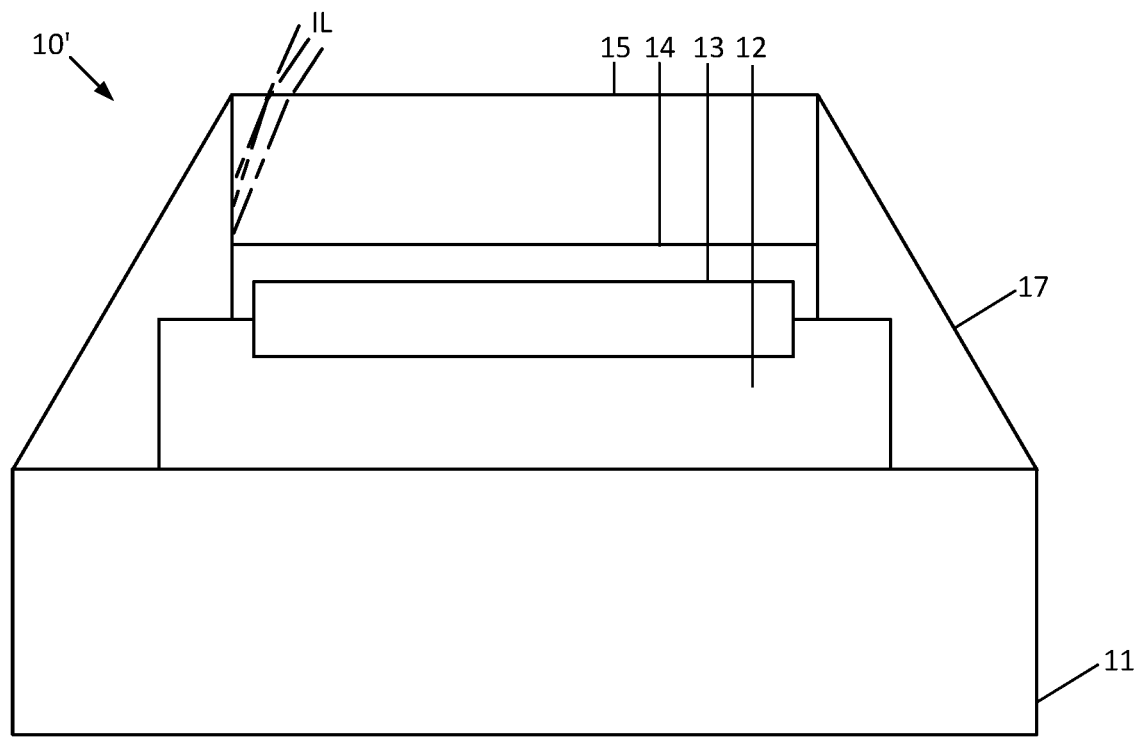
FIG. 2 is a side view of a known digital image sensor package that utilizes photoabsorbent material to mitigate the drawbacks of the known digital image sensor package of FIG. 1.

While some incoming light IL may still reflect off the sidewall 35c in a trajectory that results in it impinging upon the photodiodes 33, such instances are reduced with the designs of FIGS. 3-4 as compared to the designs of FIGS. 1-2.

Note that although the covering 35 is described as being constructed from glass, it may also be constructed from other materials, such as acrylic. In addition, note that in FIGS. 3-4, the covering 35 may be a lens, but may also not be a lens and may simply act as a cover for the image sensor substrate 32.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of reducing noise captured by an image sensor, the method comprising:
   forming a glass covering;
   affixing a bottom surface of the glass covering to the image sensor;
   permitting light to impinge upon the glass covering; and
   wherein the forming of the glass covering comprises shaping the glass covering such that when the light that impinges upon the glass covering impinges upon a sidewall of the glass covering, the sidewall reflects the light on a trajectory away from the image sensor.

2. The method of claim 1, wherein shaping the glass covering comprises shaping the glass covering to be trapezoidal in cross section such that when the light which impinges upon the glass covering impinges upon the sidewall of the trapezoidal cross section, the sidewall reflects the light on the trajectory away from the image sensor.

3. The method of claim 2, wherein the trapezoidal cross section is defined by an obtuse angle formed between the sidewall and the bottom surface of the glass covering, facilitating redirection of incoming light.

4. The method of claim 2, wherein an angle of the sidewall with respect to the bottom surface of the glass covering is adjusted based on a field of view of the image sensor and anticipated environmental lighting conditions.

5. The method of claim 2, further wherein shaping the glass covering includes cutting the glass covering using mechanical sawing or chemical etching to achieve the trapezoidal cross section.

6. The method of claim 1, wherein the glass covering is affixed to the image sensor using a transparent adhesive layer.

7. The method of claim 1, further comprising positioning the glass covering at a predetermined distance from the image sensor to optimize trajectory of reflected light away from photodiodes of the image sensor.

8. The method of claim 1, further comprising configuring a top surface of the glass covering to have a greater surface area than the bottom surface to facilitate desired light reflection characteristics of the sidewall.

9. A method of assembling a digital image sensor package, comprising:
   positioning an image sensor substrate on a printed circuit board (PCB); and
   associating a transparent covering with the image sensor substrate, the transparent covering having a bottom surface, a top surface opposite to the bottom surface, and a sidewall that delimits a perimeter edge of the transparent covering, such that the transparent covering overlies the image sensor substrate;
   wherein the associating of the transparent covering with the image sensor substrate includes forming a first angle between the sidewall and the top surface of the transparent covering, and a second angle between the sidewall and the bottom surface of the transparent covering, where the second angle is different from the first angle, such that light entering the transparent covering on a first trajectory and impinging upon the sidewall is reflected on a second trajectory that avoids the image sensor substrate, thereby reducing noise in captured images.

10. The method of claim 9, wherein the transparent covering is attached to the image sensor substrate using a transparent adhesive layer, providing for optical clarity and secure positioning of the transparent covering.

11. The method of claim 9, further comprising shaping the sidewall of the transparent covering such that the first angle is an acute angle and the second angle is an obtuse angle.

12. The method of claim 9, including selecting material forming the transparent covering is based on its optical properties to ensure it is conducive to reflecting light at desired specified angles without absorbing significant amounts of light.

13. The method of claim 9, wherein dimensions of the transparent covering are determined based on a size of the image sensor substrate and an expected range of angles of incoming light.

14. A method of forming a digital image sensor package, the method comprising:
   disposing an image sensor substrate on a printed circuit board (PCB), wherein photodiodes are formed on the image sensor substrate; and
   forming a glass covering to have a top surface with a greater surface area than a bottom surface of the glass covering, a bottom surface, and a sidewall delimiting a perimeter edge of the glass covering, the sidewall forming an obtuse angle with the bottom surface and an acute angle with the top surface such that the sidewall is angled with respect to normal to direct incoming light along a trajectory that avoids the photodiodes.

15. The method of claim 14, wherein the obtuse angle formed by the sidewall with the bottom surface is in a range of 120° to 140° and wherein the acute angle formed by the sidewall with the top surface is in a range of 40° to 60°.

16. The method of claim 14, further comprising affixing mounting hardware to the printed circuit board to surround at least a portion of a periphery of the image sensor substrate in a spaced apart fashion before coupling the glass covering to the image sensor substrate, wherein the mounting hardware supports the glass covering in a predetermined position relative to the image sensor substrate.

17. The method of claim 16, wherein the mounting hardware is formed to have a first portion affixed to the PCB extending upwardly therefrom, a second portion extending inwardly from the periphery of the image sensor substrate toward the photodiodes, and an intermediate connecting portion that connects the first portion to the second portion, structurally integrating the glass covering with the PCB and image sensor substrate.

* * * * *